United States Patent [19]
van Suchtelen et al.

[11] 3,958,211
[45] May 18, 1976

[54] GENERATOR FOR MAGNETIC DOMAINS

[75] Inventors: Taap van Suchtelen; Gerrit Frens, both of Eindhoven, Netherlands

[73] Assignee: U.S. Philips Corporation, New York, N.Y.

[22] Filed: Dec. 4, 1974

[21] Appl. No.: 529,364

[30] Foreign Application Priority Data
Dec. 20, 1973 Netherlands.................. 7317437

[52] U.S. Cl............................................ 340/174 TF
[51] Int. Cl.$^2$........................................ G11C 11/14
[58] Field of Search............... 340/174 TF, 174 SR

[56] References Cited
UNITED STATES PATENTS

| | | | |
|---|---|---|---|
| 3,789,375 | 1/1974 | Chen et al..................... | 340/174 TF |
| 3,810,133 | 5/1974 | Bobeck et al................. | 340/174 TF |
| 3,824,571 | 7/1974 | Clover, Jr. et al............ | 340/174 TF |

OTHER PUBLICATIONS

IBM Technical Disclosure Bulletin – Vol. 13, No. 12, May 1971, p. 3637
IBM TDB "Generation of Bubbles by Expansion" by Levi, Vol. 14, No. 6, 11/71, p. 1876.

*Primary Examiner*—James W. Moffit
*Attorney, Agent, or Firm*—Frank R. Trifari; Carl P. Steinhauser

[57] ABSTRACT

A source of magnetic bubbles comprises a plate of magnetic material which is situated in a principal magnetic field directed transverse to the plate, a loop conductor having an inner side and an outer side which are defined as such and in which alternately directed current pulses can be generated, and also comprising a first and a second preferred structure. The preferred structures project as far as inside the loop conductor. On the first preferred structure a magnetic bubble remains which, under the influence of a first current pulse in the loop conductor which attenuates the magnetic field, expands such that the second preferred structure is also covered. After termination of the first current pulse an oppositely directed second current pulse is applied, with the result that the principal magnetic field is intensified, the bubble is split, and each part thereof remains bound as a bubble to one of the two preferred structures, the bubble situated on the second preferred structure being driven out of the conductor loop in a reversible manner, inter alia under the control of the repulsion existing between the bubbles. After termination of the second current pulse, the bubble situated on the first preferred structure occupies a preferred position which is at least partly situated inside the loop conductor, and this bubble can be split again by a next pair of current pulses. The second preferred structure forms part of a path which comprises an element which extends without interruption in the longitudinal direction.

7 Claims, 12 Drawing Figures

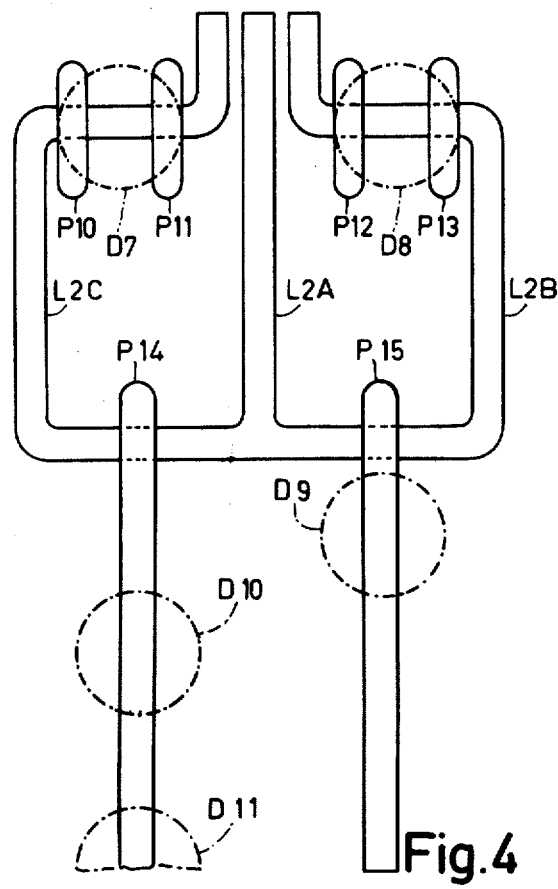
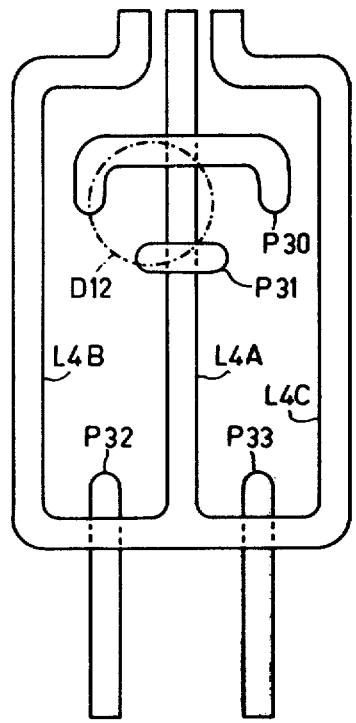
Fig.4  Fig.5
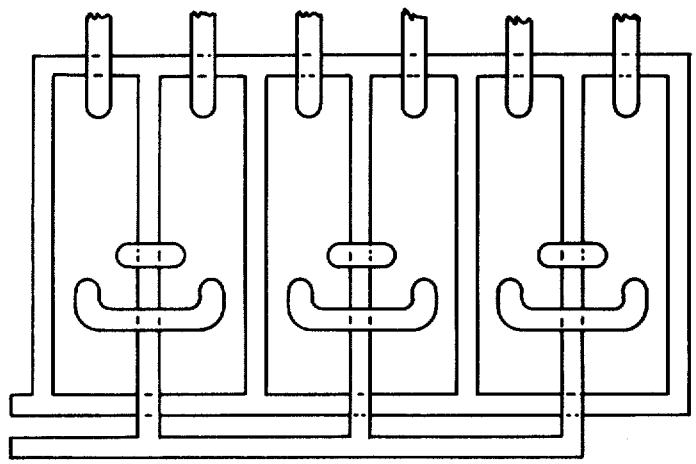
Fig.7

GENERATOR FOR MAGNETIC DOMAINS

The invention relates to a device for generating magnetic bubbles in a plate of magnetic material which is situated in a principal magnetic field directed transverse to the plate, comprising a loop conductor having an inner side and an outer side which are defined as such, at least one first and at least one second preferred structure for bubbles which extend within the loop conductor, and a current pulse generator, outputs of which are connected to connections of the loop conductor and which is capable of generating a first current pulse in the loop conductor whereby the principal magnetic field inside the said loop conductor can be attentuated so that a bubble present on one of the said preferred structures inside the loop conductor can expand as far as the further preferred structure and, after the termination of the said attenuation, can be split into split-off bubbles which are present on at least two of said preferred structures, after which a split-off bubble can be discharged. A device of this kind comprises a loop conductor shaped as a hollow "Y". Bubbles are supplied via a bubble guide structure consisting of current loops, and split-off bubbles are intercepted by detection loops. In this manner there are at least two current loops to be driven. This implies a complex control system. Furthermore, in the said device the bubbles are split off when the loop conductor is not energized after they have expanded under the influence of the first current pulse. Therefore, the principal magnetic field must be comparatively strong, like the field produced by the first current pulse. This implies a higher current intensity, so that the loop conductor is liable to burn through, particularly in the case of comparatively small bubble dimensions. Furthermore, the first current pulse intensifies the principal field on the outside of the loop conductor. This may influence bubbles present in other locations, thus giving rise to undesired disturbances. In order to avoid these disturbances, the device can be spaciously proportioned, but the additional space then required is a drawback. Furthermore, because different current pulses occur in different conductors, synchronization may be difficult.

In order to solve this problem, the invention is characterized in that after the first current pulse has been generated, an oppositely directed second current pulse can be generated by the current pulse generator in the loop conductor whereby the principal magnetic field inside the loop conductor can be intensified, under the control of which bubbles can be split off and be driven out on parts of said first and second preferred structures which extend outside the loop conductor, after the termination of the second current pulse it being possible to form a preferred position on said first preferred structure for at least one of the said split-off bubbles which is at least partly situated inside the loop conductor, and on said second preferred structure a preferred position which is completely situated outside the loop conductor for at least one of the said split-off bubbles. Because the current pulses are directed in an alternating manner, the sweep of the field strength is equally large for half the current pulse amplitude. Furthermore, the rest value of the main magnetic field may be lower, because the bubbles are split only by the intensified principal magnetic field. In addition, at the end of the second current pulse one bubble has been completely driven out of the loop conductor. When a next current pulse appears, it is driven out further by the field gradient and by the repulsive force exerted by the bubble on the first preferred structure, so that bubble splitting is automatically continued. The bubble on the first preferred structure remains available for further splitting.

The said second preferred structure preferably forms part of a rail-shaped path which comprises an element which extends without interruption in the longitudinal direction. Such a path has been described in Application Ser. No. 277,150, filed Aug. 21, 1972, now abandoned, and Ser. No. 478,575, filed June 12, 1974 which is a continuation of the aforesaid application. According to the invention a simple bubble generator is realized for connection to such a path. For the application of the bubble generator according to the invention such a path is attractive because the bubbles driven out successively push each other further, so that no additional transport device is required.

The said preferred structures provided on the plate of magnetic material preferably contain soft-magnetic material. The preferred structures may contain vapour-deposited permalloy. Other known structures comprise recesses or ridges in the plate of magnetic material.

Bubbles which are split off under the control of said second current pulse are preferably driven out along said first and said second preferred structure in directions which are transverse to each other. The bubble on the second preferred structure can thus be readily driven out.

The loop conductor preferably comprises two legs which extend together and which are connected by a bend, the said first preferred structure and the said second preferred structure alternately crossing one leg and the bend. Asymmetry is thus obtained, and it was found that the behaviour of the bubble remaining on the first preferred structure is then better defined.

The invention also relates to a device for generating magnetic bubbles, comprising at least two of the described devices in which the said second preferred structures form part of rail-shaped paths which comprise elements which extend without interruption in the longitudinal direction, a bubble being drivable along at least a first part of a first rail-shaped path by interaction with bubbles driven along a second part of the second rail-shaped path which is arranged alongside said first part, the said first and the second part being arranged adjacent the said second preferred structures, the relevant loop conductors alternately receiving pairs of first and second current pulses. Such multiple paths are known per se; if there are two of such paths, bubbles on the first path may represent zeroes and bubbles on the second path may represent ones. Because they force each other onwards cross-wise as well as on the same path, the sequence of the information bits remains unambiguous. A previous solution to this problem has been described in application Ser. No. 390,593, filed Aug. 22, 1973, now abandoned, and Ser. No. 532,260, filed Dec. 12, 1974, a continuation of said application; this concerns a single bubble generator followed by a diverging switch which is controlled by an additional loop conductor. The present invention offers more reliability.

Adjoining loop conductors preferably have a loop conductor part and a first preferred structure in common. A compact device is thus obtained.

The invention will be described in detail hereinafter with reference to a number of Figures.

Figure 3:
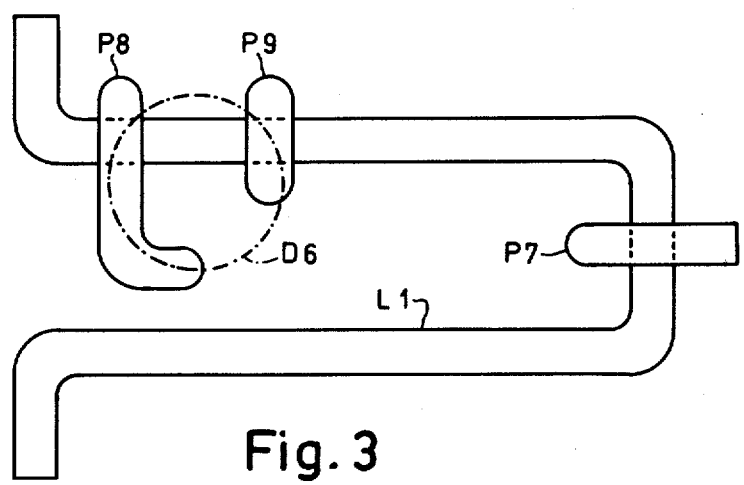
Figure 2A:
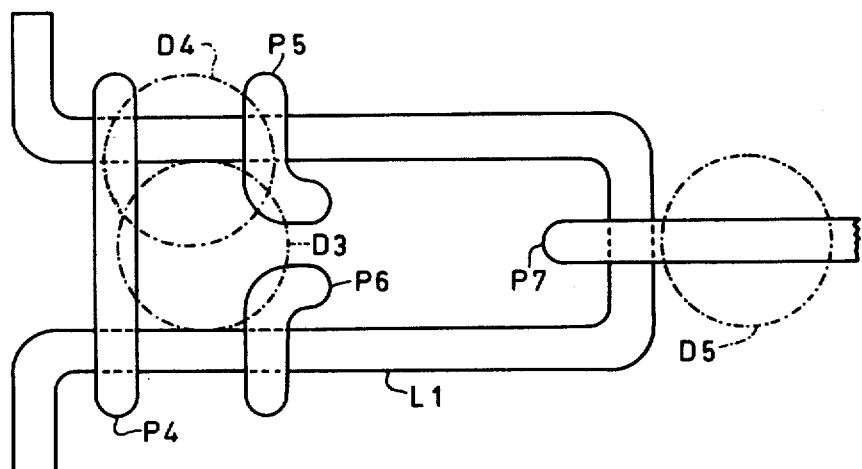
FIG. 2A is a plan view of another embodiment device according a device the invention.
Figure 2B:
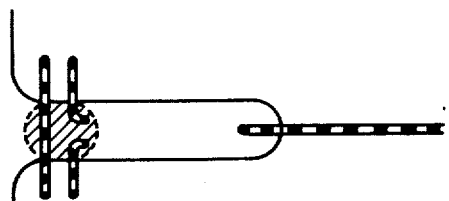
Figure 2C:
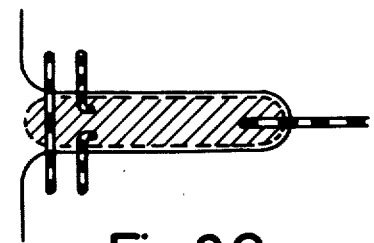
Figure 6:
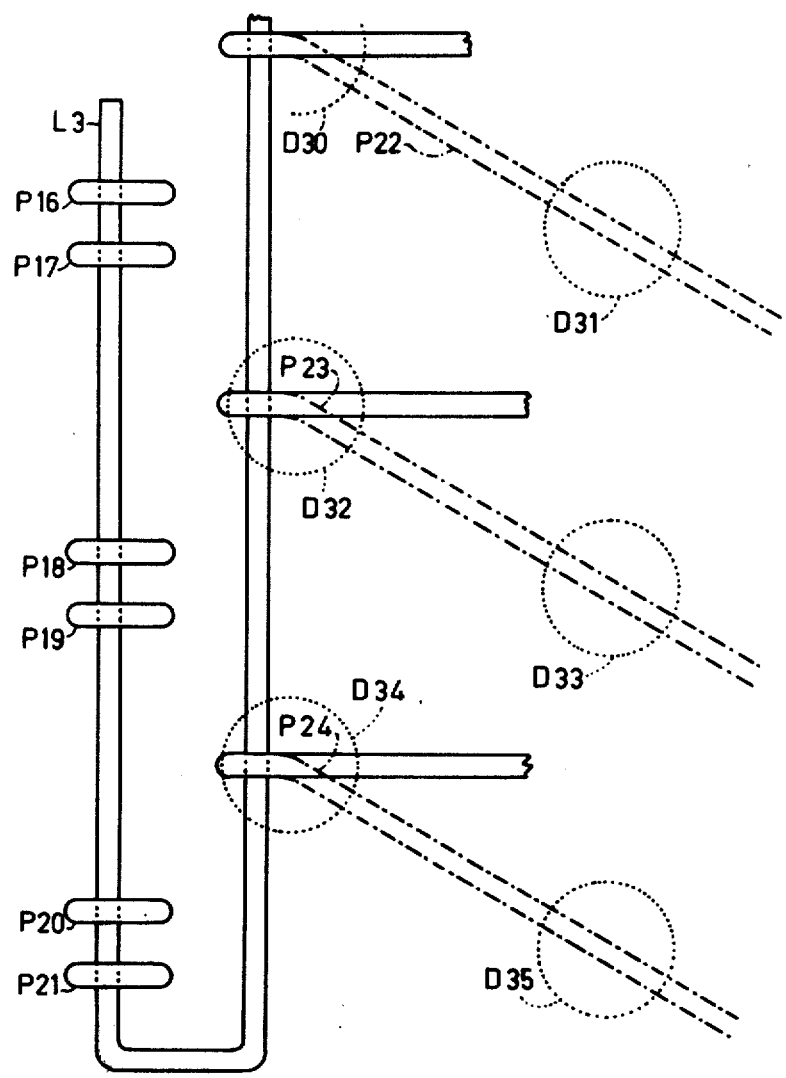

FIGS. 2b, c, d, and e show details of bubble formation;

FIG. 3 is a plan view of another embodiment of a device according to the invention having a non-symmetrical structure;

FIG. 4 shows a tandem device according to the invention;

FIG. 5 shows another tandem device according to the invention;

FIG. 6 shows still another embodiment of a device according to the invention;

FIG. 7 shows a multiple electrically connected device according to the invention.

Figure 1:
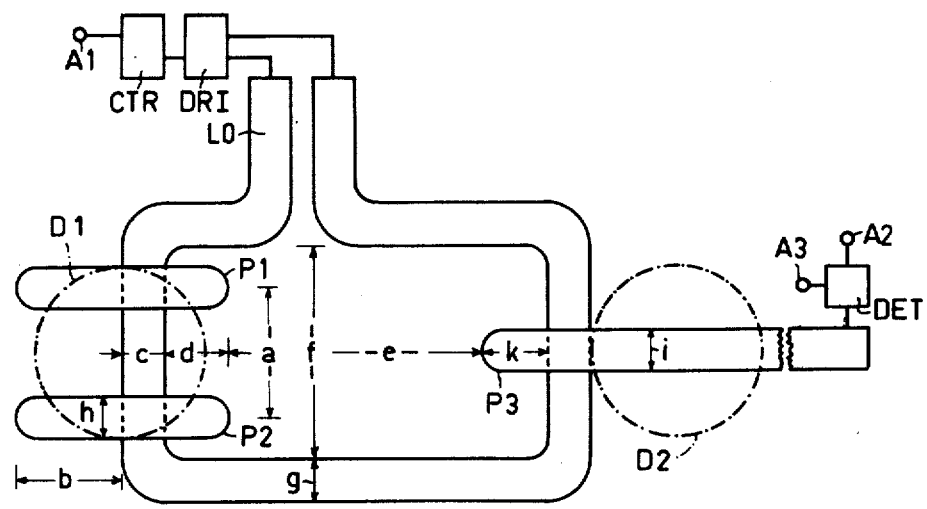
FIG. 1 is a plan view of one embodiment of a device according to the invention.
Figure 1A:
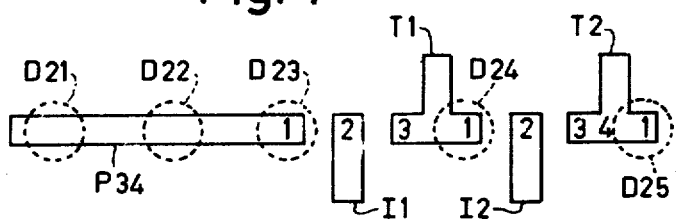
FIG. 1a shows the guide structure in FIG. 1 in more detail.

FIG. 1 shows a device according to the invention, comprising an information input terminal A1, a control unit CTR, a drive unit DRI, a loop conductor LO, three permalloy elements P1 . . . 3, a detector DET, an information output terminal A2, and a control terminal A3. The loop conductor and the permalloy elements are provided, for example, by vapour-deposition, on the plate of magnetic material which is not shown and in which bubbles can be formed, and are shown at a scale; the other elements are only shown in the form of a block diagram. The plate is arranged in a principal magnetic field which is directed transverse thereto and which is generated, for example, by a permanent magnet. Two bubbles D1, D2 are shown in preferred positions such as can be formed when the loop conductor is not energized. A maximum number of lines of force of the field of the bubble are then "short-circuited" by the permalloy. Depending on the dimensions and the thickness of the permalloy layer, the diameter of the bubble and the thickness of the plate of magnetic material, when the loop conductor is not energized, the bubble is positioned such that either the edge of the bubble coincides with the permalloy as much as possible or that the bubble itself covers an as large as possible quantity of permalloy. The repulsion between bubbles also has an effect. The locally present principal magnetic field determines the size of the bubbles. The bubble D1 is situated on a first preferred structure formed by the elements P1, P2 and has a preferred position which is situated partly inside and partly outside the loop conductor LO. The bubble D2 is situated on a second preferred structure formed by the element P3 and has a preferred position completely outside the loop conductor LO. Little or no force is required to move bubble D2 further to the right, because the quantity of permalloy covered by D2 is not changed. When the bubble D2 is moved to the left, first the repulsion by D1 increases and subsequently the quantity of permalloy covered decreases. Bubble D2 can also be subject to the force of bubbles which are not shown and which are situated to the right on the preferred structure P3. An opposing force occurs in both directions for bubble D1 when it is displaced, because less permalloy is then covered. The information input terminal A1 can receive information signals, for example, in the form of a pulse series. The control unit CTR can, for example, amplify, decode and buffer these pulses, an apply control signals to the drive unit DRI. This may be a current pulse generator which is known per se. It then supplies a first and a second current pulse to loop conductor LO via the adjacently extending supply lines of LO. As a result, bubble D1 is split into two parts which arrive in the preferred positions shown for the bubbles D1, 2 after the second current pulse has been applied; bubble D2 is driven out of the loop conductor LO to the right. There are more possibilities for the preferred structure represented by the element P3. It may be a bubble guide structure consisting of discrete elements such as shown in FIG. 1A at a reduced scale. The path P3 terminates, for example, in the path P34. Furthermore, there are provided the vapour-deposited permalloy elements I1, 2 and T1, 2. The bubbles are driven by a rotary magnetic field which rotates in the plane of the drawing. When the permalloy elements are present, the bubbles tend to move, for example, in the direction of the field. If the direction of rotation of the rotary magnetic field is counter-clockwise, the bubbles move to the right. The bubbles are denoted as D21 . . . 25. If the rotary magnetic field is directed to the right, bubble D23 is situated, for example, in position 1 of element P34. When the rotary magnetic field rotates upwards, the bubble jumps to position 2 on I-element I1, assisted by the repulsion experienced from bubbles D21, 22. Another possibility is that the discrete elements have an "angelfish" structure. The bubbles are then driven by fluctuations in the principal magnetic field.

The preferred structure can completely consist of an uninterrupted path. In application Ser. No. 532,260 many feasible uses are described in which adjacently extending paths have the functions of gearwheels, pawls and cams. Path P3 may have a bubble destruction element connected thereto. The figure shows a known detector DET which supplies detection signals on information output terminal A2, possibly under the control of control signals on terminal A3. On the path P3 the bubbles can occupy positions at a slightly varying distance from each other, the arrangement initially being approximately equidistant. The deviation may be, for example ± 20%. If the distance becomes too small, the repulsion increases and after the second current pulse the bubble D2 is driven back inside the loop conductor. When the next first current pulse is applied, the bubbles D1 and D2 are combined so that after the subsequent second current pulse the net result is that no bubble is produced. The operation and proportioning of the device according to FIG. 1 will be described in detail hereinafter.

Figure 2D:
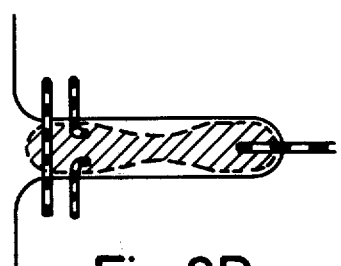
Figure 2E:
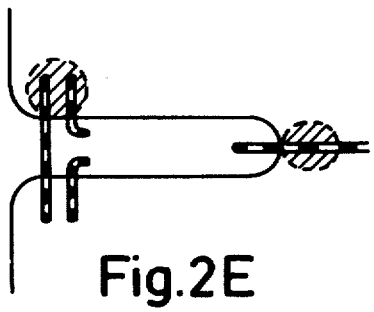

FIG. 2A shows a device according to the invention, comprising a loop conductor L1 and four permalloy elements P4 . . . 7. Also shown are three bubble positions D3 . . . 5. The right-hand side of the Figure is defined as the outer zone of the loop conductor L1; the remainder is defined as the inner zone. In contrast with FIG. 1, the supply conductors do not extend together. The permalloy elements correspond as regards function, but not as regards shape with those of FIG. 1. FIGS. 2B–E show situations occurring during the generation of a bubble. Assume that only bubble D3 is present. A preferred position is present on a first preferred structure formed by the elements P4 . . . 6, notably if just no bubble is present on position D5 (see FIG. 2B which is shown at a reduced scale). Further elements of FIG. 1 (CTR, DRI, . . . ) have been omitted for the sake of simplicity. A first current pulse attenuates the field inside and, to a lesser extent, to the left of the loop conductor. The attenuation is large near the loop conductor and smaller at further removed areas. Similarly, the principal magnetic field outside, i.e. to the right of the loop conductor, is intensified, the intensification being higher as the distance is smaller. The variations are greater at areas where the curvature of the loop conductor is directed towards the relevant point, i.e. in the "inner curve". The bubbles tend to move to positions of lower intensity of the principal magnetic field in as far as the effect of the permalloy elements is negligible. The size of the bubbles increases as the field decreases: below a given field strength, the size increases almost without restriction (run-out field). Beyond a given field strength, the bubbles implode (collapse field). If the first current pulse is strong enough, the situation of FIG. 2C arises: approximately the run-out field prevails inside the loop; the principal magnetic field to the left of the loop conductor is hardly reduced because at this area only the vertically directed parts of the loop conductor have an effect. After the first current pulse, the field becomes stronger (FIG. 2D). The enlarged bubble tends to adhere to the permalloy elements. The bubble also has cohesion, and the principal magnetic field is not strong enough to overcome the cohesion. An oppositely directed second current pulse intensifies the magnetic field in the loop conductor and attenuates this field outside the loop. The stretched bubble is split if the adhesive forces between the bubble and the permalloy are larger than the cohesive forces between the stretched part of the bubble of FIG. 2D. The intensified principal magnetic field drives the bubbles out of the loop as far as indicated in FIG. 2E. The drive-out force is large because below the loop conductor a strong magnetic field gradient prevails from an intensified field (inside the loop) to an attenuated field (outside the loop). After the end of the second current pulse, the situation may be as represented by the bubble positions D4, 5 in FIG. 2A. The bubble D4 is situated partly inside the loop conductor L1. The bubble D5 is situated completely outside the loop conductor L1. When a next first current pulse is applied, the bubble represented by D4 is first driven to position D3 because a strong magnetic field gradient appears from the intensified field outside the loop to the attenuated field inside the loop. Subsequently, the bubble expands in accordance with FIG. 2C. The bubble shown in position D5 is subject to a force to the right because of the gradient of the magnetic field and the repulsion by the other bubble. Therefore, this bubble is forced to the right. It may be that to the right of the loop conductor L1 there are further bubbles present on the preferred structure, i.e. to the right of the bubble position D5. If these bubbles are sufficient in number, the preferred position D5 is displaced to the left so far that it is partly situated inside the loop. In that case both split-off bubbles are drawn inside the loop by the first current pulse and are joined.

The bubble position D4 is non-symmetrical with respect to the locally present permalloy elements. During the second current pulse the bubble position D3 is in an unstable equilibrium. Small irregularities in the structure determine to which side this bubble is driven out.

Therefore, FIG. 3 shows a non-symmetrical structure comprising permalloy elements P8, 9 and an equilibrium position for a bubble D6. The other elements correspond to those of FIG. 2A. Now there is no unstable position D3, and it is unambiguously determined in which direction the bubble is driven out. The operation of the device is, therefore, more reliable. The arrangement shown in FIG. 2 is more critical. In given cases, when a second current pulse is applied a bubble in position D3 can also be split into two bubbles which are simultaneously driven out in two directions. For these bubbles the circumstances may be so unfavorable that they are both destroyed.

Therefore, FIG. 1 gives a number of dimensions by way of example. For an equilibrium diameter of a bubble D: $b, d, k$ are ½ D; $c, h, g, i$ are: ⅓ D; $a$ is: ¾ D; $f$ is: 5/4 D; $e$ is: 3/2 D. Other values could be: $f$ is: D; $c, h, g, i$ are: ¼ D; $e$ is: 2 D.

The elements P1, 2 project into the loop and are not interconnected. Therefore, the expansion is facilitated. The advantage of an arrangement as shown in the FIGS. 2, 3 over that of FIG. 1 is that the driveout directions are transverse to each other. Bubble D5 is more readily driven out, because the bubbles in the positions D3, 4, 6 hardly "give way" in the horizontal direction. They have the function of a pawl.

FIG. 4 shows a tandem-arranged device for generating bubbles, comprising a double loop conductor L2A, L2B/C, six permalloy elements P10 . . . 15, and five bubble positions D7 . . . 11. The two halves are constructed substantially as shown in FIG. 1. A drive unit not shown now produces a first and a second current pulse in one of the two loop conductors, for example, in L2A/L2C. As a result, bubble D7 is split, whilst the bubbles D10, 11 are forced onwards. The paths P14, 15 are so near to each other that the bubble split off from D7 cannot pass the bubble D9, because they repel each other. As a result, D9 is forced onwards, D9 in its turn forcing the bubble D10 onwards. Similarly, a first and a second current pulse can be generated in the loop L2A/L2B. The bubble D8 is then split if bubble D9 moves slightly further than shown, and the bubbles D10, 11 are also forced onwards. When one of the two loop conductors is energized, an information pattern of binary zeroes (bubbles on P14) and ones (bubbles on P15) can be generated on the two perferred structures. Because the bubbles do not pass each other, there will be no errors. The bubbles D10, 11 are shown to be too near to each other in order to save space. The distances usually amount to several bubble diameters. It is sometimes possible to make a first current pulse in the conductors L2A/L2C coincide with a second current pulse in the conductors L2A/L2B, because they have the same direction as far as the conductor L2A is concerned. The current intensity sometimes has to be adjusted in such a case.

FIG. 5 shows a tandem-arranged device for generating bubbles having a construction corresponding to that shown in FIG. 3. There are provided a double loop conductor L4A, L4B/C and four permalloy elements P30 . . . 33, and one preferred position is shown for a bubble D12. The arrangement is symmetrical with respect to the central conductor L4A. Only a single bubble remains on the preferred structure which is formed by the permalloy elements P30, 31. The preferred position D12 can also be symmetrically situated with respect to L4A or anti-symmetrically with respect to the preferred position D12 shown. There may also be a plurality of preferred positions on the said preferred structure which are separated from each other only by comparatively low potential hills. Depending on whether the first current pulse occurs in the loop conductor consisting of the conductors L4A, B or in that consisting of the conductors L4A, C, a bubble will be created, after the associated second current pulse, on the preferred structure formed by the element P32 or the element P33, respectively.

FIG. 6 shows a device according to the invention, comprising a loop conductor L3 and nine permalloy elements P16 . . . 24. A first current pulse reduces the field inside the loop such that a bubble present, for example, at P18, 19, is expanded as far as P23, and possibly even fills the entire loop. In reaction to a second current pulse, this bubble is then split into six parts situated near P16/17, P18/19, P20/21, P22, P23, P24. The latter three bubbles are driven out as already described. Subsequently, another first current pulse is generated. If the preferred structures P22, 23, 24 extend at an angle of 30° as denoted by stroke-dot lines, the driven-out bubbles form a bubble field, bubbles on the one preferred structure corresponding to intermediate spaces between the bubbles on the neighbouring preferred structures. The preferred structures P22 . . . 24 can also extend perpendicularly as denoted by uninterrupted lines.

Similarly, FIG. 7 shows a multiple and electrically parallel-connected device as shown in FIG. 5. The even and odd paths can alternately receive a bubble, with the result that, like in FIG. 6, a bubble field is produced where bubbles on the one preferred structure correspond to intermediate spaces between the bubbles on the neighbouring preferred structures. Using, for example, optical means, bubbles in the bubble field can be selectively destroyed. This can be used, for example, as a detector for optical images. The various conductor loops of FIG. 7 can also be electrically series-connected.

In the foregoing merely a few possibilities as as regards the configuration of the loop conductors and the permalloy elements were described. Within the scope of the invention it is equally possible to provide grooves in or raised portions on the plate of magnetic material instead of permalloy material.

What is claimed is:

1. A device for generating magnetic bubbles in a plate or magnetic material which is situated in a principal magnetic field directed transverse to the plate, comprising a loop conductor having an inner side and an outer side, at least one first and at least one second preferred structure for bubbles which extend within the loop conductor, and current pulse generator means having output means which are connected to connections of the loop conductor, said generator means producing a first current pulse in the loop conductor whereby the principal magnetic field inside the said loop conductor is attenuated and a bubble present on one of the said preferred structures inside the loop conductor expands as far as one of said preferred structures and, after the termination of the said attenuation, is split into split-off bubbles which are present on at least two of said preferred structures, after which a split-off bubble is discharged, said generator means also producing, after the first current pulse has been generated, an oppositely directed second current pulse in the loop conductor, whereby the principal magnetic field inside the loop conductor is intensified, under the control of which bubbles are split off and driven out on parts of said first and second preferred structures which extend outside the loop conductor, at least one of the split-off bubbles, after termination of the second current pulse, being at least partly situated inside the loop conductor at a preferred position on said first preferred structure, and at least one of the said split-off bubbles being positioned at a preferred position on said second structure which is completely situated outside the loop conductor.

2. A device as claimed in claim 1, wherein the said second preferred structure forms part of a rail-shaped path which comprises an element which extends without interruption in the longitudinal direction.

3. A device as claimed in claim 1, wherein the said preferred structures contain soft-magnetic material which is provided on the plate of magnetic material.

4. A device as claimed in claim 1, wherein bubble split off under the control of said second current pulse is driven out along said first and second preferred structure in directions which are transverse to each other.

5. A device as claimed in claim 4, wherein the loop conductor comprises two legs which extend adjacently and which are connected by a bend, the said first preferred structure and the said second preferred structure alternately crossing one leg and the bend.

6. A device for generating magnetic bubbles, comprising at least two devices as claimed in claim 1, with corresponding first and second preferred structures and corresponding adjoining loop conductors, wherein the said second preferred structures form part of rail-shaped paths which comprise elements which extend without interruption in the longitudinal direction, a bubble being drivable along at least a first part of a first railshaped path by interaction with bubbles driven along a second part of the second rail-shaped path which is arranged alongside said first part, the said first and the second part being arranged adjacent the said second preferred structures, the relevant loop conductors alternately receiving pairs of first and second current pulses.

7. A device as claimed in claim 6, characterized in that adjoining loop conductors have a loop conductor part and a first preferred structure in common.

* * * * *